United States Patent

Shaheen et al.

[15] 3,662,358

[45] May 9, 1972

[54] INTERSTITIAL CONDUCTORS BETWEEN PLATED MEMORY WIRES

[72] Inventors: Joseph M. Shaheen, La Habra; John Simone, Garden Grove, both of Calif.

[73] Assignee: North American Rockwell Corporation

[22] Filed: June 12, 1970

[21] Appl. No.: 45,678

[52] U.S. Cl...............340/174 PW, 340/174 M, 340/174 TF, 340/174 VA

[51] Int. Cl.....................................G11c 11/14, G11c 11/04

[58] Field of Search.............................340/174 PW, 174 VA

[56] References Cited

UNITED STATES PATENTS 3,553,648 1/1971 Gorman et al. .................340/174 PW 3,460,113 8/1969 Hisao Maeda..................340/174 PW

*Primary Examiner*—James W. Moffitt

*Attorney*—L. Lee Humphries, H. Fredrick Hamann and Robert G. Rogers

[57] ABSTRACT

Single copper layers on two double copper clad dielectric boards are etched into strips. The strips are used as masks for permitting channels to be etched in the exposed surfaces of the dielectric substrates. After the channels have been etched, the copper strips are re-etched into a preferred interstitial conductor width. The two boards are joined together with the copper strips and channels in registration for forming tunnels for accommodating plated memory wires. The copper strips comprising the interstitial conductors between the tunnels are connected together at a common point.

5 Claims, 3 Drawing Figures

INVENTORS
JOSEPH M. SHAHEEN
JOHN SIMONE
BY
Robert G. Rogers
ATTORNEY

INVENTORS
JOSEPH M. SHAHEEN
JOHN SIMONE
BY Robert G. Rogers
ATTORNEY

INTERSTITIAL CONDUCTORS BETWEEN PLATED MEMORY WIRES

BACKGROUND OF THE INVENTION

1. Field of the Invention

The invention relates to interstitial conductors between tunnels of a plated wire memory mat and more particularly interstitial conductors comprising mating conducting strips on the surfaces of two double metal clad dielectric boards separated by channels in the dielectric substrates which are placed together in registration for forming double layered interstitial conductors separated by tunnels for plated memory wires.

2. Description of Prior Art

U.S. Pat. No. 3,501,830, issued Mar. 24, 1970 to T. F. Bryzinski et al., for Methods of Making a Filamentary Magnetic Memory Using Flexible Sheet Metal teaches and shows a process for forming channels for accommodating plated memory wires called filaments. In one process, polystyrene is molded into layers for forming a channel structure. Copper clad flexible sheets are formed on the both sides of the polystyrene layers to complete the plated wire memory structure. Filaments are inserted into the channels before the tunnel structure is formed. The filaments are replaced by magnetically coated filaments subsequently. The patent also shows how electrical connections are made to the plated memory wires.

It is pointed out, however, that the patent does not teach or show interstitial conductors between each of the plated memory wires. The process also requires that removable wires (filaments) be inserted into the tunnel structure as the tunnel structure is being formed. A process is preferred in which the tunnels can be formed without the necessity for using removable wires as taught by the patent.

Interstitial conductors are necessary to reduce the electrical field between plated memory wires during the operation of the structure as a plated wire memory. If the electrical interference between wires can be reduced, the plated memory wires can be placed closer together for increasing the density of the plated wire memory.

The present invention is a process for producing a plated wire memory tunnel structure without the necessity for removing wires and for forming interstitial conductors between plated wire memory tunnels. The invention also contemplates the structure which results from the process.

SUMMARY OF THE INVENTION

Briefly, the invention comprises the resulting product and a process for forming interstitial conductors separated by tunnels for plated memory wires by initially forming conducting metal strips on the surfaces of two dielectric substrates. The surface areas of the dielectric substrate exposed after the strips have been formed is removed for forming channels in each board. In the preferred embodiment, the width of the conducting metal strips is reduced after the channels are formed to eliminate potential electrical contact with plated memory wires in the tunnels. The boards are then joined so that the conducting strips and the channels are in registration.

Word straps, orthogonal to the tunnels, are then formed on the outer surfaces of both substrates. The word straps on both surfaces are interconnected to complete an electrical path around the tunnels.

The connecting metal strips comprising the interstitial conductors are interconnected at a common point to provide electrical continuity between all of the interstitial conductors. Plated memory wires are inserted into the tunnels.

The plated memory wires and the word straps may be inserted into an electrical connector for providing power, electrical ground connections, input and output signals. The common connection of the interstitial conductors will be connected to electrical ground.

Therefore, it is an object of this invention to provide a process for producing a plated memory mat in which interstitial conductors are formed between tunnels for plated memory wires.

It is another object of this invention to provide a plated memory mat having interstitial conductors formed between tunnels for plated memory wires.

It is another object of this invention to provide a process and a product for reducing an electrical field interference between adjacent plated memory wires.

It is still another object of this invention to provide an improved process and product for increasing the bit density of a plated wire memory.

It is still a further object of this invention to provide a process in which channels and conducting strips are formed on double metal clad dielectric boards which are formed together with the channels and conducting strips in registration for forming tunnels for plated memory wires separated by interstitial conductors.

It is a still further object of this invention to provide a plated memory mat having tunnels for plated memory wires and a two layer interstitial conductor between each of the tunnels.

A further object of this invention is to provide a plated memory mat in which the interstitial conductors are centrally located between the word straps and are interposed between the tunnels for the plated memory wires.

These and other objects of the invention will become more apparent when taken in connection with the following description of the invention which includes a brief description of the drawings and a description of the preferred embodiments.

DESCRIPTION OF THE PREFERRED EMBODIMENTS

Figure 1:
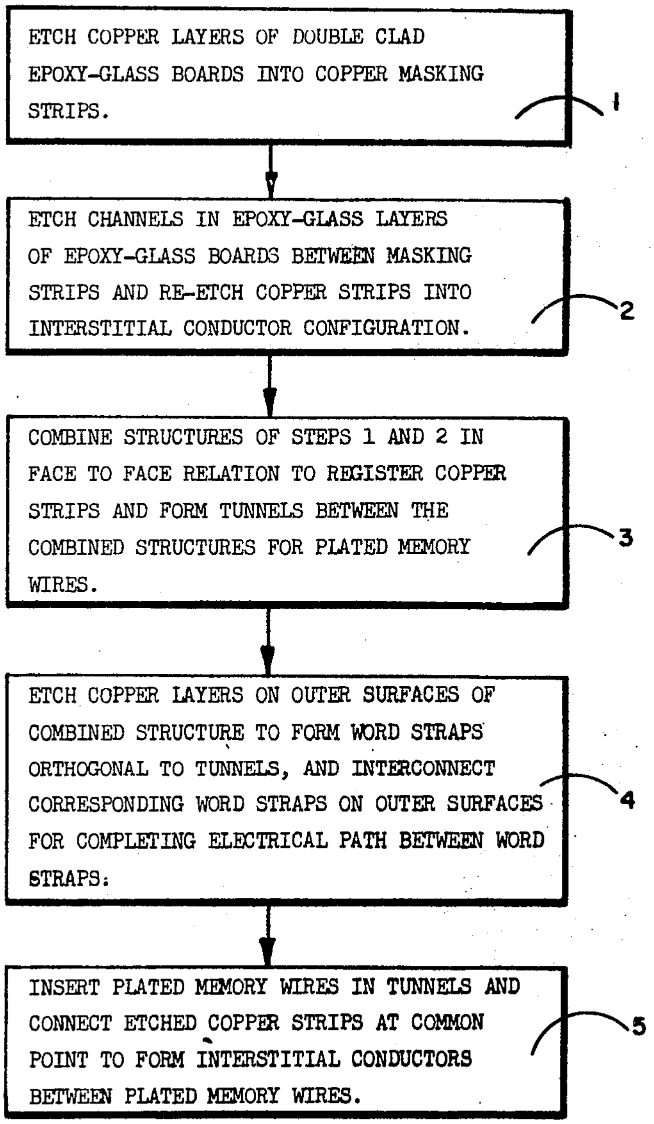
FIG. 1 is a block diagram showing the steps of the invention.

FIG. 1 is a block diagram showing the steps of the process for producing the double layered interstitial conductors between tunnels of a plated wire memory mat. The process steps are best understood by referring to FIGS. 2 and 3 of the drawings.

In step 1, one metal layer of each of two double conducting metal clad dielectric boards are masked and etched to form parallel conducting metal strips. The dielectric board may be comprised of two copper metal layers laminated on the outside surfaces of a dielectric substrate comprising, for example, a one-half mil polyimide film and a 3-mil epoxy-glass layer. The copper layers may be 1 or ½ ounce copper. In other embodiments, other conducting metal layers may be used. In addition, the dielectric substrate may be comprised of insulating materials other than epoxy-glass. For example, a polyimide insulating layer in combination with other insulating layers may be used or the polyimide layer as well as other insulating layers may be used individually.

Standard photo resist masking techniques and etching may be used to mask and etch the copper layers into copper strips. In a preferred embodiment, one copper layer is 1 ounce and another copper layer is one-half ounce. The ½-ounce copper layer is masked for exposing copper strips having widths of approximately 0.01 inch. Solder plating is deposited on the exposed copper strips.

The photo resist is then removed to expose 0.003-inch openings between the solder plated copper strips. The exposed copper is etched to the epoxy-glass layer by using an etchant such as ferric chloride.

In step 2, the exposed epoxy-glass layers of both dielectric boards are etched, for example, using an etchant comprising $HF \cdot H_2SO$. The epoxy-glass layers are etched to the polyimide insulating layers of both boards. Ordinarily, when the epoxy-glass layers are etched, a slight metal overhang develops. As a result, it is necessary to re-etch the overhanging copper strips so that each of the strips has a width less than the width of the top of the unetched epoxy-glass layers forming ridges between the etched channels. The re-etched copper strips cannot make electrical contact with the copper layers forming the interstitial conductors.

In step 3, the dielectric boards are combined in a face to face relationship so that the solder plated copper strips are in registration. In addition, the channels etched in the epoxy-glass layers are also in registration between the interstitial conductors for forming tunnels having a configuration for accommodating plated memory wires.

The structures are placed in a press or oven and subjected to a predetermined temperature and pressure for fusing the structure together. The temperature is selected as a function of the flow temperature of the solder plating on the copper strips. Afterwards, the combined structures are cooled to room temperature.

Figure 2:
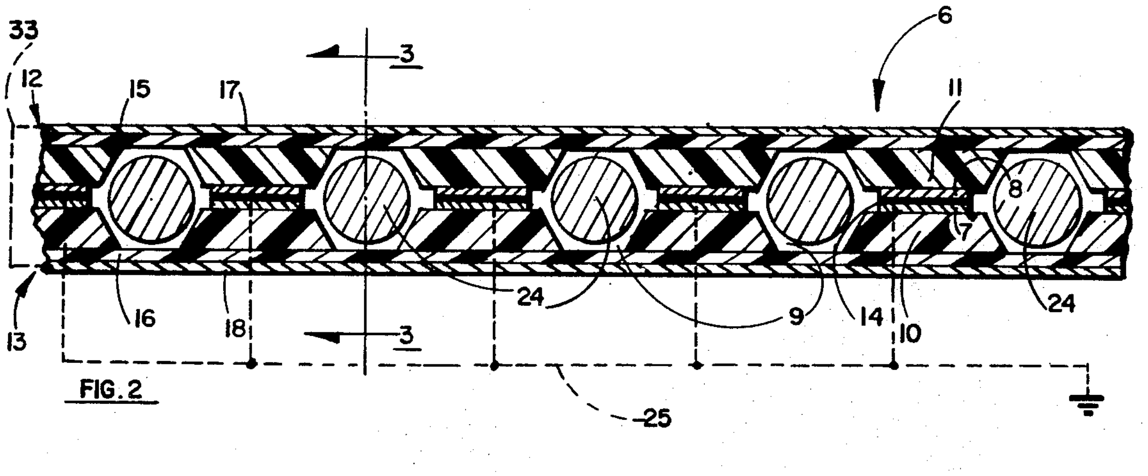
FIG. 2 is an end view of one embodiment of the plated wire memory showing the two layered interstitial conductors between each of the tunnels for the plated memory wires.

FIG. 2 is an end view of one embodiment of a plated wire memory mat 6 showing the two generally identified interstitial layers 7 and 8 between each of the tunnels 9 formed by ridges 10 and 11 of the two dielectric boards 12 and 13. The interstitial conductors 7 and 8 are connected by the solder plating layer 14. The dielectric boards 12 and 13 include polyimide layers 15 and 16, respectively and are clad by copper layers 17 and 18, respectively.

In step 4, the metal layers on the outer surfaces of the dielectric boards are masked and etched to form word straps which are orthogonal to the tunnels formed in step 3. The metal such as 1-ounce copper layers may be masked by standard photo resist techniques and etched by a ferric chloride etchant. Word straps on both surfaces correspond to each other. The corresponding word straps are electrically connected at one edge of the plated wire memory mat for completing an electrical path around the tunnels in the plated wire mat.

One method for interconnecting the word straps is by plated-through-hole techniques as described and shown in connection with patent application titled "Interstitial Conductors Between Plated Memory Wires" filed on June 12, 1970, under Ser. No. 45,677 by Joseph M. Shaheen, et al. However, other techniques are also within the scope of the invention. The word strap interconnection is illustrated by the numeral 33.

Figure 3:
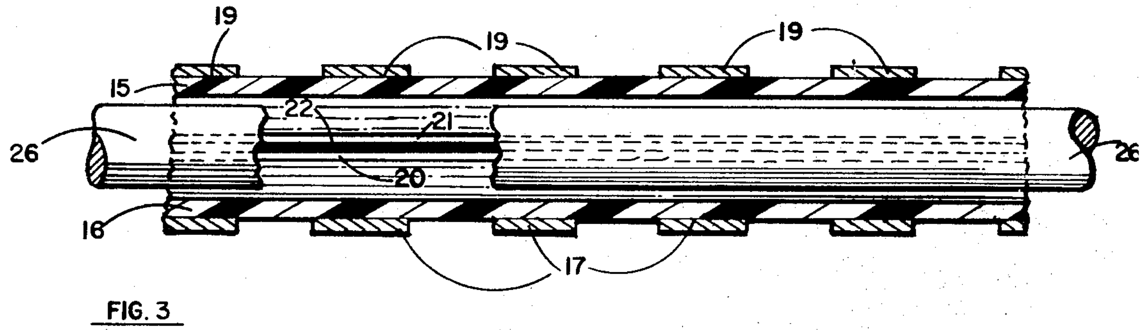
FIG. 3 is a cross-sectional view of the FIG. 2 embodiment taken along line 3—3 showing the relationship of the plated memory wires and the interstitial conductors which are centrally located between externally disposed word straps.

In FIG. 3, the relationship of the word straps identified generally by the numeral 19 on both surfaces of the polyimide layers 15 and 16 is clearly shown. In addition, specifically identified interstitial conductors 20 and 21 connected together by specifically identified solder layer 22 are also illustrated. Specific plated memory wire 26 is also shown.

In step 5, the plated memory wires 24 are inserted in the tunnels. In addition, the interstitial conductors are connected together at a common point which is ordinarily grounded during the operation of the plated wire memory. The connection at a common point may be made by standard plating techniques wherein a conducting layer such as copper is deposited in a pattern between the interstitial conductors to provide electrical continuity between all or a part of the interstitial conductors. In addition, the interstitial conductors may be formed with a protruding plate that can be laminated to the outer surfaces of the polyimide layers of the plated wire memory mat for forming a ground plane. One illustration of a ground plane can be seen by referring to the previously referenced patent application. The connection of the interstitials at a common point is illustrated in FIG. 2 by dotted line 25.

In the usual case, the plated memory wires are inserted in the tunnels after the interstitials have been connected together at a common point. As a result, contamination breakage, etc., of the plated memory wires is reduced.

Although as indicated in connection with steps 1 and 2, a solder layer is plated over the etched interstitial conductors, in other embodiments, the two boards 12 and 13 including their interstitials, may be fused together by use of an adhesive layer coated on the surfaces of the interstitials. For the latter embodiment, the interstitials would not be electrically connected except at the common connections described in connection with step 5.

In operation, information is written into a selected memory bit location along a plated memory wire by passing a current down a selected word strap in coincidence with a bit current being passed down a plated memory wire. The polarity of the bit current determines whether a logic "1" and/or a logic "0" is written at the intersection of the word strap and the plated wire. The interstitials prevent the electrical field in one plated wire from causing information to be written into the adjacent bit portions on either side of the selected plated wire.

It would be possible to avoid the interference between plated memory wires by extending the distance between the wires. However, it is preferred to have an increased storage capacity without increasing the size of the plated wire memory. The relatively increased capacity without the necessity for increasing the size of the plated wire memory mat.

We claim:

1. A plated wire memory mat having tunnels for plated memory wires, said mat comprising, first and second dielectric layers adjacent to each other, said layers each including channels, said channels being in registration with each other for forming tunnels for plated memory wires, first and second plurality of interstitial conductors secured to the tops of said first and second dielectric layers respectively between said tunnels, means for joining said first and second plurality of interstitials conductors together whereby said first and second dielectric layers are joined together.

2. The plated wire memory mat recited in claim 1 wherein said means for joining comprises a layer of conducting metal over the surfaces of said interstitial conductors.

3. The plated wire memory mat recited in claim 1 wherein said first and second dielectric layers each comprise a layer of a first material and a layer of second material, said channels being in the layers of said first material.

4. The plated wire memory mat recited in claim 3 further including conducting metal strips on the outer surfaces of said first and second dielectric layers, said conducting metal strips being orthogonal to said tunnels for forming word straps for said plated wire memory mat.

5. The plated wire memory mat recited in claim 4 wherein said tunnels each having approximately equal depth whereby said interstitial conductors are located approximately in the center of said plated wire memory mat between the outer surfaces thereof.

* * * * *